(12) United States Patent
Nakahara

(10) Patent No.: US 10,325,895 B2
(45) Date of Patent: Jun. 18, 2019

(54) SEMICONDUCTOR MODULE

(71) Applicant: Mitsubishi Electric Corporation, Tokyo (JP)

(72) Inventor: Kenta Nakahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 237 days.

(21) Appl. No.: 15/459,982

(22) Filed: Mar. 15, 2017

(65) Prior Publication Data
US 2018/0090473 A1 Mar. 29, 2018

(30) Foreign Application Priority Data

Sep. 27, 2016 (JP) .................. 2016-187706

(51) Int. Cl.
*H01L 25/18* (2006.01)
*H01L 23/495* (2006.01)
(Continued)

(52) U.S. Cl.
CPC .......... *H01L 25/18* (2013.01); *H01L 23/3735* (2013.01); *H01L 23/49524* (2013.01); (Continued)

(58) Field of Classification Search
CPC ................. H01L 25/18; H01L 23/3735; H01L 23/49558; H01L 24/40; H01L 24/32; H01L 23/49524; H01L 23/49589; H01L 2924/181; H01L 2224/8484; H01L 2224/84801; H01L 24/37; H01L 24/84; H01L 2224/29339; H01L 2224/37147; (Continued)

(56) References Cited

U.S. PATENT DOCUMENTS

2013/0256856 A1 10/2013 Mahler et al.
2014/0284781 A1* 9/2014 Asaoka ............ H01L 23/49589
257/676
2015/0064844 A1 3/2015 Mahler et al.

FOREIGN PATENT DOCUMENTS

DE 10 2008 035 993 A1 2/2010
DE 10 2013 103 085 A1 10/2013
(Continued)

OTHER PUBLICATIONS

An Office Action issued by the German Patent Office dated Mar. 22, 2019, which corresponds to German Patent Application No. 10 2017 216 981.8 and is related to U.S. Appl. No. 15/459,982.

*Primary Examiner* — Kyoung Lee
(74) *Attorney, Agent, or Firm* — Studebaker & Brackett PC

(57) ABSTRACT

It is an object of the present invention to provide a semiconductor module in which a bonded portion has high reliability, and that has a small area. A semiconductor module includes a plurality of metal plates extending in a horizontal direction and stacked in a vertical direction, at least one switching element, and at least one circuit element. The at least one switching element is bonded between two of the plurality of metal plates, facing each other in a vertical direction. The at least one circuit element is bonded between two of the plurality of metal plates, facing each other in a vertical direction. Disposed between the plurality of metal plates is an insulating material. At least one of the plurality of metal plates is bonded to the at least one switching element and the at least one circuit element.

17 Claims, 6 Drawing Sheets

(51) Int. Cl.
  *H01L 23/00* (2006.01)
  *H02H 9/04* (2006.01)
  *H01L 23/373* (2006.01)
  *H01L 29/16* (2006.01)
  *H01L 29/739* (2006.01)
  *H01L 29/78* (2006.01)

(52) U.S. Cl.
  CPC ........ *H01L 23/49558* (2013.01); *H01L 24/32* (2013.01); *H01L 24/40* (2013.01); *H02H 9/041* (2013.01); *H01L 23/49562* (2013.01); *H01L 23/49575* (2013.01); *H01L 23/49589* (2013.01); *H01L 24/37* (2013.01); *H01L 24/84* (2013.01); *H01L 29/1608* (2013.01); *H01L 29/7393* (2013.01); *H01L 29/78* (2013.01); *H01L 2224/29339* (2013.01); *H01L 2224/32265* (2013.01); *H01L 2224/37124* (2013.01); *H01L 2224/37147* (2013.01); *H01L 2224/40105* (2013.01); *H01L 2224/40139* (2013.01); *H01L 2224/40195* (2013.01); *H01L 2224/40237* (2013.01); *H01L 2224/8484* (2013.01); *H01L 2224/84801* (2013.01); *H01L 2924/10272* (2013.01); *H01L 2924/13055* (2013.01); *H01L 2924/13091* (2013.01); *H01L 2924/181* (2013.01); *H01L 2924/19041* (2013.01); *H01L 2924/19043* (2013.01); *H01L 2924/19103* (2013.01); *H01L 2924/19105* (2013.01)

(58) Field of Classification Search
  CPC ..... H01L 2224/37124; H01L 23/49575; H01L 2224/40139; H01L 2224/40237; H01L 2924/10272; H01L 2924/13055; H01L 2924/13091; H01L 2924/19105; H01L 23/49562; H01L 2224/40195; H01L 2924/19041; H01L 2924/19043; H01L 2924/19103; H01L 29/1608; H01L 29/7393; H01L 29/78; H01L 2224/32265; H01L 2224/40105
  See application file for complete search history.

(56) References Cited

FOREIGN PATENT DOCUMENTS

| | | |
|---|---|---|
| JP | H09-116091 A | 5/1997 |
| JP | 2011-249410 A | 12/2011 |
| JP | 2013-179229 A | 9/2013 |

* cited by examiner

F I G. 1
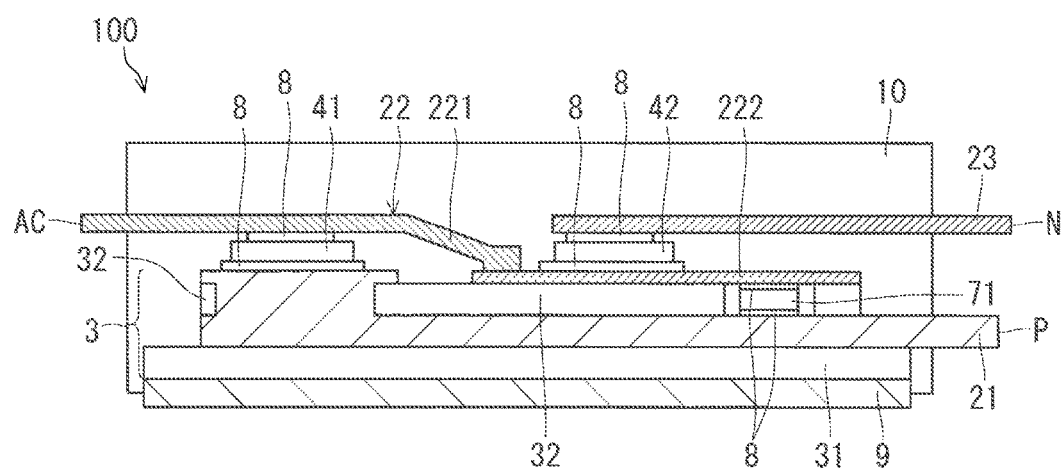
F I G. 2
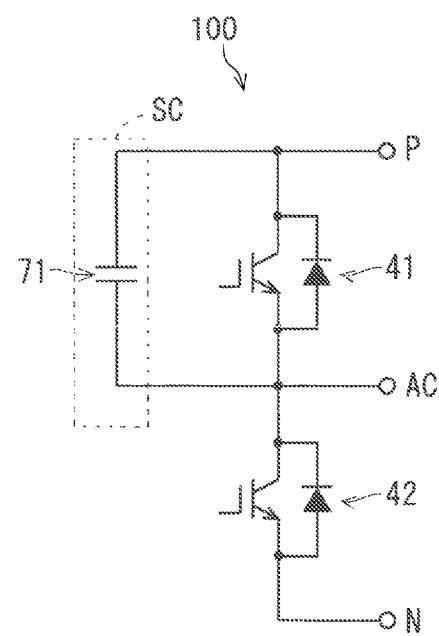

F I G. 3
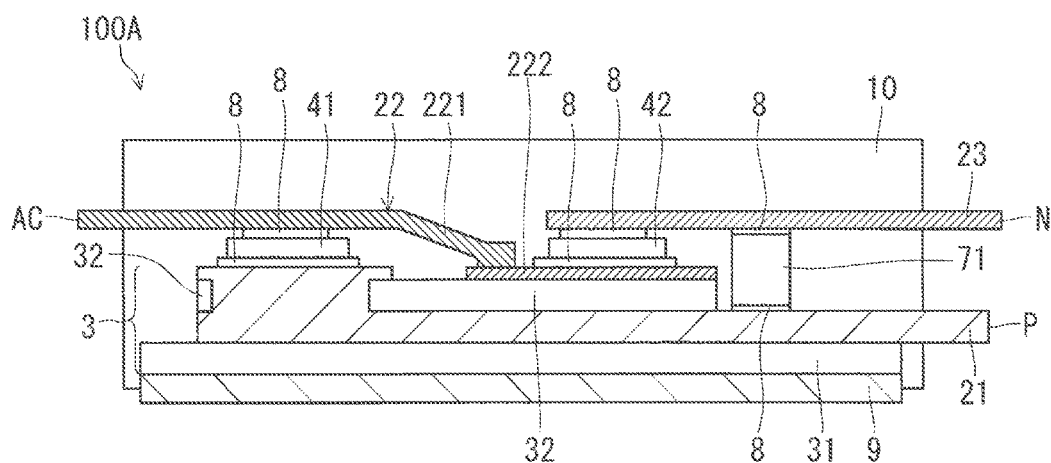
F I G. 4
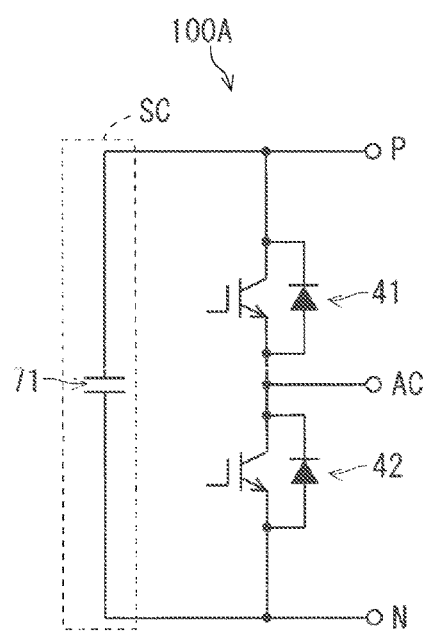

F I G. 5
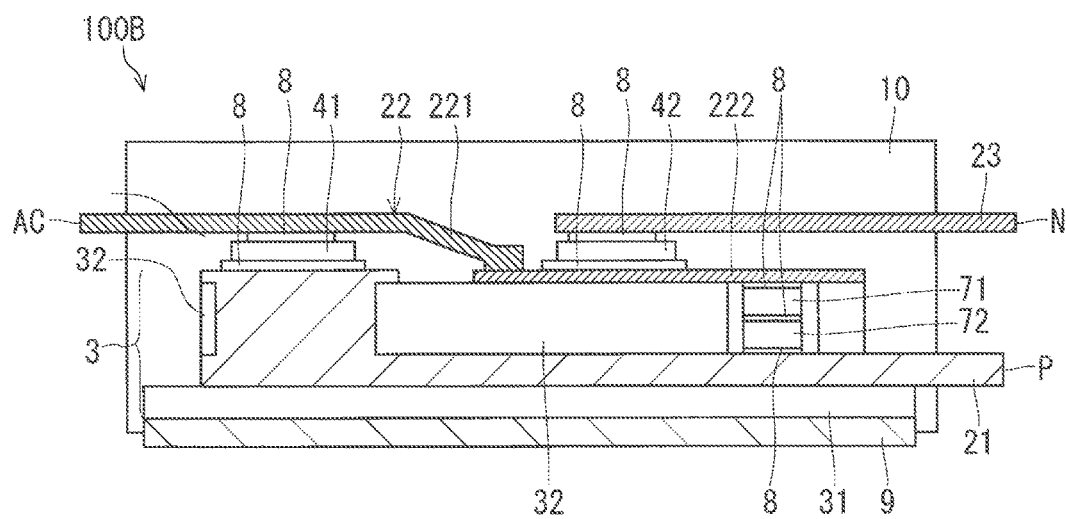
F I G. 6
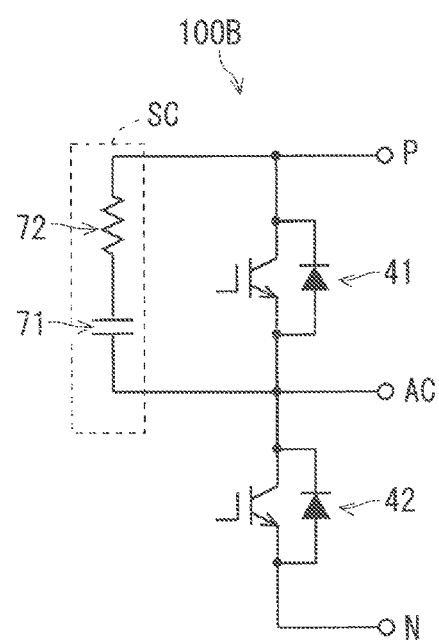

F I G . 1 1
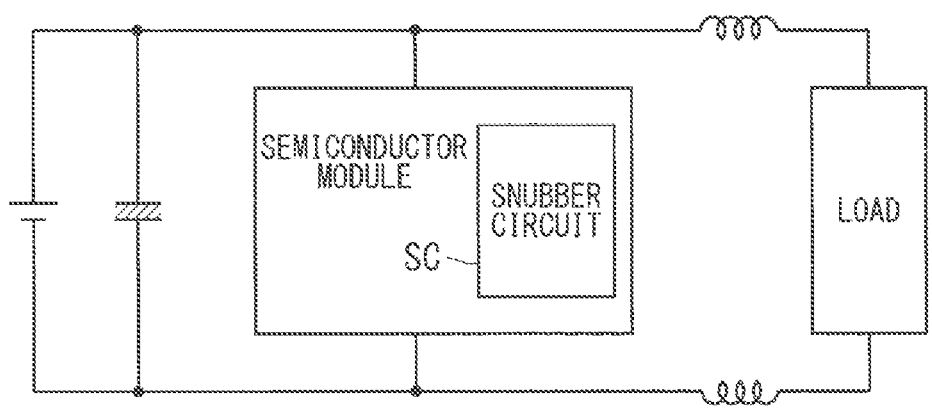

SEMICONDUCTOR MODULE

BACKGROUND OF THE INVENTION

Field of the Invention

The present invention relates to semiconductor modules.

Description of the Background Art

A conventional semiconductor module includes a switching element and a multilayer wiring board on which a circuit element, such as a capacitor or a resistor element is mounted. This circuit element, such as the capacitor and the resistor element is conventionally bonded to a circuit pattern disposed on a substrate, in a horizontal direction. Alternatively, one electrode is bonded to the circuit pattern, and the other electrode is connected to the circuit pattern through a metal wire (e.g., see Japanese Patent Application Laid-Open No, 9-116091).

The circuit element is conventionally mounted on the substrate in a horizontal direction. Unfortunately, this needs a large area for mounting the circuit element. In addition, the use of the metal wire for connecting the circuit element to the substrate results in an increase in area for mounting the circuit element, and also results in low reliability of wire bonding.

SUMMARY OF THE INVENTION

It is an object of the present invention to provide a semiconductor module in which a bonded portion has high reliability, and that has a small area for mounting a circuit element.

A semiconductor module accord ing to an aspect of the present invention includes a plurality of metal plates extending in a horizontal direction and stacked in a vertical direction, at least one switching element, and at least one circuit element. The at least one switching element is bonded between two of the plurality of metal plates, facing each other in a vertical direction. The at least one circuit element is bonded between two of the plurality of metal plates, facing each other in a vertical direction. An insulating material is disposed between the plurality of metal plates. At least one of the plurality of metal plates is bonded to the at least one switching element and the at least one circuit element.

The semiconductor module according to an aspect of the present invention is configured such that the circuit element is bonded between the two metal plates facing each other in a vertical direction. Such a configuration reduces the area for the mounting of the circuit element to thus provide a small semiconductor module. Such a configuration also reduces warping due to the difference between the thermal expansion coefficient of each metal plate and the thermal expansion coefficient of the circuit element, when compared with a configuration in which the circuit element is disposed on the metal plate in a horizontal direction. Consequently, high reliability of the bonded portion is achieved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view of a semiconductor module according to a first preferred embodiment;

FIG. 2 is a diagram of a circuit configuration of the semiconductor module according to the first preferred embodiment;

FIG. 3 is a cross-sectional view of a semiconductor module according to a first modification of the first preferred embodiment;

FIG. 4 is a diagram of a circuit configuration of the semiconductor module according to the first modification of the first preferred embodiment;

FIG. 5 is a cross-sectional view of a semiconductor module according to a second modification of the first preferred embodiment;

FIG. 6 is a diagram of a circuit configuration of the semiconductor module according to the second modification of the first preferred embodiment;

FIG. 11 is a diagram of a circuit configuration of a semiconductor module with the snubber circuit incorporated thereinto.

DESCRIPTION OF THE PREFERRED EMBODIMENTS

First Preferred Embodiment

Figure 7:
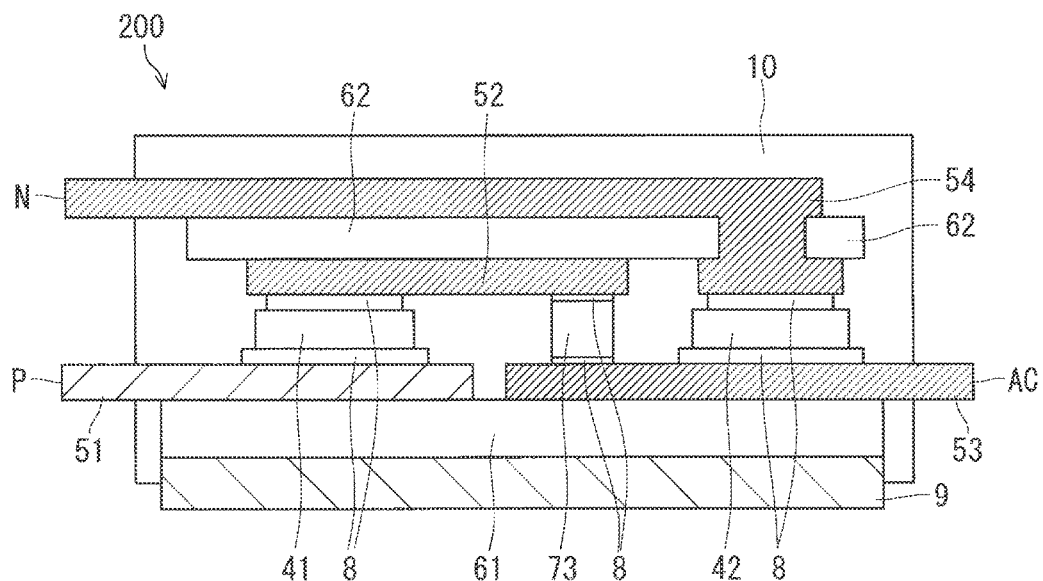
FIG. 7 is a cross-sectional view of a semiconductor module according to a second preferred embodiment.

FIG. 1 is a cross-sectional view of a semiconductor module 100 according to a first preferred embodiment. As illustrated in FIG. 1, the semiconductor module 100 includes a first metal plate 21, second metal plate 22, and third metal plate 23 extending in a horizontal direction and stacked in a vertical direction, a first switching element 41, a second switching element 42, and a circuit element 71.

The first and second switching elements 41 and 42 are each, a transistor, such as an insulated gate bipolar transistor (IGBT) or a metal-oxide-semiconductor field-effect transistor (MOSFET). Each of the first and second switching elements 41 and 42 has main electrodes on both surfaces. In some embodiments, each of the switching elements 41 and 42 incorporates a freewheeling diode. The circuit element 71 is a passive element, such as a capacitor or a resistor element, or is an active element such as a diode. The circuit element 71 has electrodes at both ends.

The second metal plate 22 has a first portion 221 and a second portion 222 bonded to each other. The first metal plate 21 protrudes, at one end, outside a package of the semiconductor module 100. This one end functions as a positive electrode (hereinafter also referred to as electrode P). The second metal plate 22 protrudes, at one end, outside the package of the semiconductor module 100. This one end functions as an AC electrode (hereinafter also referred to as electrode AC). The third metal plate 23 protrudes, at one end, outside the package of the semiconductor module 100. This one end functions as a negative electrode (hereinafter also referred to as electrode N).

The "metal plates extending in a horizontal direction" herein do not need to be metal plates that are even in a horizontal direction; for instance, these metal plates herein may be uneven, like the second metal plate 22. These metal plates do not necessarily need to have the same thickness;

that is, the metal plates may have thicknesses different from each other in accordance with, for instance, an allowable current, a required strength of each metal plate, or the structure of a layered substrate. The first metal plate 21, the second plate 22, and the third metal plates 23 may form a circuit pattern.

The first metal plate 21 and the second metal plate 22 form a multi-layer substrate 3 along with an insulating substrate 31 and with an insulating substrate 32. The first switching element 41 is disposed between the first metal plate 21 and the first portion 221 of the second metal plate 22. The respective electrodes on both surfaces of the first switching element 41 are bonded, in a face-to-face manner, to the first metal plate 21 and the first portion 221 of the second metal plate 22 facing each other in a vertical direction, through a conductive bonding material 8. Here, the conductive bonding material 8 is, for instance, a sintered bonding material containing solder or silver particles.

The second switching element 42 is disposed between the second portion 222 of the second metal plate 22 and the third metal plate 23. The respective electrodes on both surfaces of the second switching element 42 are bonded, in a face-to-face manner, to the second portion 222 of the second metal plate 22 and the third metal plate 23 facing each other in a vertical direction, through the conductive bonding material 8.

The circuit element 71 is disposed between the first metal plate 21 and the second portion 222 of the second metal plate 22. The respective electrodes at both ends of the circuit element 71 are bonded, in a face-to-face manner, to the first metal plate 21 and the second portion 222 of the second metal plate 22 facing each other in a vertical direction, through the conductive material 8. The circuit element 71 extends through the insulating substrate 32 disposed between the first metal plate 21 and the second portion 222 of the second metal plate 22. The circuit element 71 is bonded between the electrode P and the electrode AC, in parallel with the first switching element 41.

Disposed is a heat spreader 9 on the back surface of the multi-layer substrate 3, i.e., on a surface opposite to a surface at which the switching element 41 is disposed. Except for the edges of the electrodes P, N, and AC and the heat spreader 9, the first metal plate 21, the second metal plate 22, the third metal plate 23, the insulating substrates 31 and 32, the first switching element 41, the second switching element 42, and the circuit element 71 are sealed by an insulating resin 10.

In the first preferred embodiment, the circuit element 71 is bonded between the first and second metal plates 21 and 22. In some embodiments, the circuit element 71 is bonded to another position. For instance, the circuit element 71 may be bonded between the second and third metal plates 22 and 23 (i.e., between the electrode AC and the electrode N), or between the first and third metal plates 21 and 23 (i.e., between the electrode P and the electrode N).

In the first preferred embodiment, the semiconductor module 100 includes a single circuit element 71. In some embodiment, the semiconductor module 100 includes a plurality of circuit elements 71.

In the semiconductor module 100, let the thickness of each of the first, second and third metal plates 21, 22, and 23 be 0.25 mm or greater. In view of the electrical conduction and heat generation of a power module, a greater thickness of each metal plate reduces a current density during the electrical conduction between the switching elements 41 and 42. Such a greater thickness also reduces heat generated in the metal plate to thus enable a large current to flow through the semiconductor module. In addition, the metal plate is mainly made of a material, such as aluminum (Al) or copper (Cu). Copper, in particular, has a low resistivity and a high thermal-conductivity. Hence, the use of copper enables a large current to flow through the semiconductor module and also enables the semiconductor module to have a low thermal-resistance.

In the semiconductor module 100, the insulating substrates 31 and 32 are made of organic resin or ceramic. When the insulating substrates 31 and 32 are made of organic resin, let the thickness of each of the insulating substrates 31 and 32 be 0.1 mm or greater. This thickness of each of the insulating substrates 31 and 32, i.e., 0.1 mm or greater, achieves an insulation performance and reliability both of which are required, for instance, when an user applies, for use, a voltage ranging from 600 V to 6.5 kV between the positive and negative electrodes of the semiconductor module 100.

When the insulating substrates 31 and 32 are made of ceramic, such as $Al_2O_3$, AlN, or $Si_3N_4$, let the thickness of each of the insulating substrates 31 and 32 be 0.32 mm or grater. This thickness of each of the insulating substrates 31 and 32, i.e., 0.32 mm or greater achieves an insulation performance, reliability, and a sufficient strength of the insulating substrates 31 and 32 all of which are required, for instance, when the user applies, for use, a voltage of 1200 V between the positive and negative electrodes of the semiconductor module 100.

As described above, each of the first, second and third metal plates 21, 22, and 23 has a thickness of 0.25 mm or greater; in addition, each of the insulating substrates 31 and 32 has a thickness of 0.32 mm or greater. These thicknesses achieve a semiconductor module through which a large current flows and to which a high voltage is applied.

FIG. 2 is a diagram of a circuit configuration of the semiconductor module 100. As illustrated in FIG. 2, the first and second switching elements 41 and 42 are connected in series. The circuit element 71 is bonded to first switching element 41 in parallel with each other. Let the circuit element 71 be a capacitor, for instance. Accordingly, provided is a snubber circuit SC that prevents a surge voltage caused by a switching operation of the first switching element 41.

<Effect>

In the first preferred embodiment, the semiconductor module 100 includes a plurality of metal plates (first, second, and third metal plates 21, 22, and 23) extending in a horizontal direction and stacked in a vertical direction, at least one switching element (first and second switching elements 41 and 42), at least one circuit element 71. The at least one switching element is bonded between two of the plurality of metal plates, facing each other in a vertical direction. The at least one circuit element circuit element 71 is bonded between two of the plurality of metal plates, facing each other in a vertical direction. Between the plurality of metal plates is disposed an insulating material. At least one of the plurality of metal plates is bonded to the at least one switching element and the at least one circuit element 71.

In the first preferred embodiment, the semiconductor module 100 is configured such that, like in the bonding of the switching elements, the circuit element 71 is bonded between the two metal plates facing each other in a vertical direction. Such a configuration reduces the area required for the mounting of the circuit element 71 to thus enable the semiconductor module 100 to be small. Such a configuration also reduces warping due to the difference between the thermal expansion coefficient of each metal plate and the thermal expansion coefficient of the circuit element 71, when compared with a configuration in which the circuit element 71 is disposed on the metal plate in a horizontal direction. Consequently, high reliability of a bonded portion is achieved.

In the first preferred embodiment, the semiconductor module 100 is configured such that the insulating substrate 32, i.e. the insulating material is disposed between the two metal plates (first and second metal plates 21 and 22) facing each other, and that the at least one circuit element 71 is bonded between the two metal plates facing each other in a vertical direction in such a manner that the at least one circuit element extends through the insulating substrate 32.

In the first preferred embodiment, the semiconductor module 100 is configured such that the circuit element 71 is bonded in such manner as to extend through the insulating substrate 32, which includes, on both surfaces, the first and second metal plates 21 and 22. Such a configuration reduces the area required for the mounting of the circuit element 71, and at the same time, enables the circuit element 71 to be disposed between the first and second metal plates 21 and 22.

In the first preferred embodiment, the semiconductor module 100 is configured such that the at least one switching element (first and second switching elements 41 and 42) includes the electrodes on both surfaces, and that these electrodes on both surfaces of the at least one switching element are bonded, in a face-to-face manner, to the respective two metal plates facing each other in a vertical direction, through the conductive bonding material 8. The semiconductor module 100 is also configured such that the at least one circuit element 71 includes the electrodes at both ends, and that these electrodes at both ends of the at least one circuit element 71 are bonded to the respective two metal plates facing each other in a vertical direction, through the conductive bonding material 8.

When the circuit element 71 is disposed on the metal plate in a horizontal direction, bonded to the metal plate is one of the surfaces of each of the electrode at both ends of the circuit element 71. This increases a stress applied to the circuit element when the temperature changes. In contrast, the first preferred embodiment describes that the electrodes at both ends of the circuit element 71 are bonded, in a face-to-face manner, to the respective two metal plates facing each other in a vertical direction, through the conductive bonding material 8. This reduces the stress applied to the circuit element 71 when the temperature changes. Consequently, the semiconductor module 100 is more reliable.

In the first preferred embodiment, the semiconductor module 100 is configured such that the metal plates (first, second, and third metal plates 21, 22, and 23) each have a thickness of 0.25 mm or greater. An increase in thickness of each metal plate reduces a current density during the electrical conduction between the switching elements 41 and 42. In addition, the increase in thickness reduces heat generated in each metal plate to thus enable a large current to flow through the semiconductor module.

In the first preferred embodiment, the semiconductor module 100 is configured such that the insulating substrates 31 and 32 each contain a ceramic material, and that these insulating substrates each have a thickness of 0.32 mm or greater. This thickness of each of the insulating substrates 31 and 32, i.e. 0.32 mm or greater achieves the insulation performance, reliability, and the sufficient strength of the insulating substrates 31 and 32, all of which are required, for instance, when the user applies, for use, a voltage of 1200 V between the positive and negative electrodes of the semiconductor module 100.

First Modification of First Preferred Embodiment

FIG. 3 is a cross-sectional view of a semiconductor module 100A according to a first modification of the first preferred embodiment. As illustrated in FIG. 3, the semiconductor module 100A is configured such that the circuit element 71 is bonded between the first and third metal plates 21 and 23 facing each other in a vertical direction. The other components, which are the same as those in the first preferred embodiment (FIG. 1), are not described herein.

FIG. 4 is a diagram of a circuit configuration of the semiconductor module 100A. As illustrated in FIG. 4, the circuit element 71 is connected in parallel with the first and second switching elements 41 and 42 connected in series. Let the circuit element 71 be a capacitor, for instance. Accordingly, the snubber circuit SC is provided that prevents the surge voltage caused by the switching operations of the first and second switching elements 41 and 42.

Second Modification of First Preferred Embodiment

FIG. 5 is a cross-sectional view of a semiconductor module 100B according to a second modification of the first preferred embodiment. As illustrated in FIG. 5, the semiconductor module 100B is configured such that circuit elements 71 and 72 connected in series are bonded between the first and second metal plates 21 and 22 facing each other in a vertical direction. Here, the circuit element 71 and the circuit element 72 are directly bonded to each other in series through the conductive bonding material 8. The other components, which are the same as those in the first preferred embodiment (FIG. 1), are not described herein.

FIG. 6 is a diagram of a circuit configuration of a semiconductor module 100B. As illustrated in 6, the circuit elements 71 and 72, connected in series, are connected in parallel with the first switching element 41. Let the circuit elements 71 and 72 be a capacitor and a resistor element, for instance. Accordingly, the snubber circuit SC is provided that prevents the surge voltage caused by the switching operation of the first switching element 41.

In the second modification of the first preferred embodiment, the semiconductor module 100B is configured such that the at least one circuit element includes a plurality of circuit elements, and that the plurality of circuit elements 71 and 72 connected in series are bonded between the two metal plates (first and second metal plates 21 and 22) facing each other in a vertical direction.

The plurality of circuit elements connected in series are bonded between the two metal plates facing each other in a vertical direction. Such a configuration reduces the area required for the mounting of the plurality of circuit elements to thus enable the semiconductor module 100B to be small.

Second Preferred Embodiment

FIG. 7 is a cross-sectional view of a semiconductor module 200 according to a second preferred embodiment. As illustrated in FIG. 7, the semiconductor module 200 includes a first metal plate 51, second metal plate 52, third metal plate 53, and fourth metal plate 54 extending in a horizontal direction and stacked in a vertical direction, the first switching element 41, the second switching element 42, and a circuit element 73. The first and second switching elements 41 and 42, which are the same as those in the first preferred embodiment, are not described herein. The circuit element 73 is identical to the circuit element 71 in the first preferred embodiment, and thus is not described herein.

The first metal plate 51 protrudes, at one end, outside a package of the semiconductor module 200. This one end functions as a positive electrode. The third metal plate 53 protrudes, at one end, outside the package of the semiconductor module 200. This one end functions as an AC electrode. The fourth metal plate 54 protrudes, at one end, outside the package of the semiconductor module 200. This one end functions as a negative electrode.

The first and third metal plates 51 and 53 are disposed on the front surface of an insulating substrate 61. The heat spreader 9 is disposed on the back surface of the insulating substrate 61. The first and third metal plates 51 and 53 are disposed on the insulating substrate 61 and spaced from each other by a distance required for insulation. The second and fourth metal plates 52 and 54 are disposed on both surfaces of an insulating substrate 62. The fourth metal plate 54 partly extends through the insulating substrate 62 via, for instance, a through hole so as to be disposed on the same surface as the second metal plate 52.

The first switching element 41 is disposed between the first metal plate 51 and the second metal plate 52. The electrodes on both surfaces of the first switching element 41 are bonded, in a face-to-face manner, to the respective first metal plate 51 and second metal plate 52 facing each other in a vertical direction, through the conductive bonding material 8.

The second switching element 42 is disposed between the third metal plate 53 and the fourth metal plate 54. The electrodes on both surfaces of the second switching element 42 are bonded, in a face-to-face manner, to the respective third metal plate 53 and fourth metal plate 54 facing each other in a vertical direction, through the conductive bonding material 8.

The circuit element 73 is disposed between the second metal plate 52 and the third metal plate 53. Electrodes at both ends of the circuit element 73 are bonded, in a face-to-face manner, to the respective second metal plate 52 and third metal plate 53 facing each other in a vertical direction, through the conductive bonding material 8. The circuit element 73 is sealed by the insulating resin 10. The circuit element 73 is bonded between the first and second switching elements 41 and 42, in series with the first and second switching elements 41 and 42.

Except for the ends of the electrodes, P, N, and AC, and the heat spreader 9, the insulating resin 10 seals the first, second, third and fourth metal plates 51, 52, 53 and 54, and the insulating substrates 61 and 62, the first and second switching elements 41 and 42, and the circuit element 73.

In the second preferred embodiment, the circuit element 73 is bonded between the second and third metal plates 52 and 53. In some embodiments, the circuit element 73 is bonded in another position. For instance, the circuit element 73 may be bonded between the first and second metal plates 51 and 52, between the third and fourth metal plates 53 and 54 (i.e., between the electrode AC and the electrode N), or between the first and fourth metal plates 51 and 54 (i.e., between the electrode P and the electrode N).

In the second preferred embodiment, the semiconductor module 200 includes a single circuit element 73. In some embodiment, the semiconductor module 200 includes a plurality of circuit elements 73.

In the semiconductor module 200, let the thickness of each of the first, second, third and fourth metal plates 51, 52, 53, and 54 be 0.25 mm or greater. In view of the electrical conduction and heat generation of a power module, a greater thickness of each metal plate reduces a current density during the electrical conduction between the switching elements 41 and 42. Such a greater thickness also reduces heat generated in the metal plate to thus enable a large current to flow through the semiconductor module. In addition, the metal plate is mainly made of a material, such as aluminum (Al) or copper (Cu). Copper, in particular, has a low resistivity and a high thermal-conductivity. Hence, the use of copper enables a large current to flow through the semiconductor module and also enables the semiconductor module to have a low thermal-resistance.

In the semiconductor module 200, the insulating substrates 61 and 62 are made of organic resin or ceramic. When the insulating substrates 61 and 62 are made of organic resin, let the thickness of each of the insulating substrates 61 and 62 be 0.1 mm or greater. This thickness of each of the insulating substrates 61 and 62, i.e., 0.1 mm or greater, achieves an insulation performance and reliability both of which are required, for instance, when an user applies, for use, a voltage ranging from 600 V to 6.5 kV between the positive and negative electrodes of the semiconductor module 200.

When the insulating substrates 61 and 62 are made of ceramic, such as $Al_2O_3$, AlN, or $Si_3N_4$, let the thickness of each of the insulating substrates 61 and 62 be 0.32 mm or grater. This thickness of each of the insulating substrates 61 and 62, i.e., 0.32 mm or greater achieves an insulation performance, reliability, and a sufficient strength of the insulating substrates 61 and 62 all of which are required, for instance, when the user applies, for use, a voltage of 1200 V between the positive and negative electrodes of the semiconductor module 200.

In the semiconductor module 200, let the thickness of the insulating resin 10 be 0.1 mm or greater between the metal plates facing each other in a vertical direction. This thickness of the insulating resin 10, i.e., 0.1 mm or greater achieves an insulation performance and reliability, for instance, when the user applies, for use, a voltage ranging from 600 V to 6.5 kV between the positive and negative electrodes of the semiconductor module 200.

<Effect>

In the second preferred embodiment, the semiconductor module 200 is configured such that the insulating resin 10, i.e., an insulating material is disposed between the two metal plates (second and third metal plates 52 and 53) facing each other, and that the at least one circuit element 73 is bonded between the two metal plates facing each other in a vertical direction, and is sealed by the insulating resin 10.

In second preferred embodiment, the semiconductor module 200 is configured such that the circuit element 73 is bonded between the second and third metal plates 52 and 53 facing each other with the insulating resin 10 interposed therebetween. Such a configuration reduces the area required for the mounting of the circuit element 73, and at the same time, enables the circuit element 73 to be bonded between the second and third metal plates 52 and 53.

Third Preferred Embodiment

Figure 8:
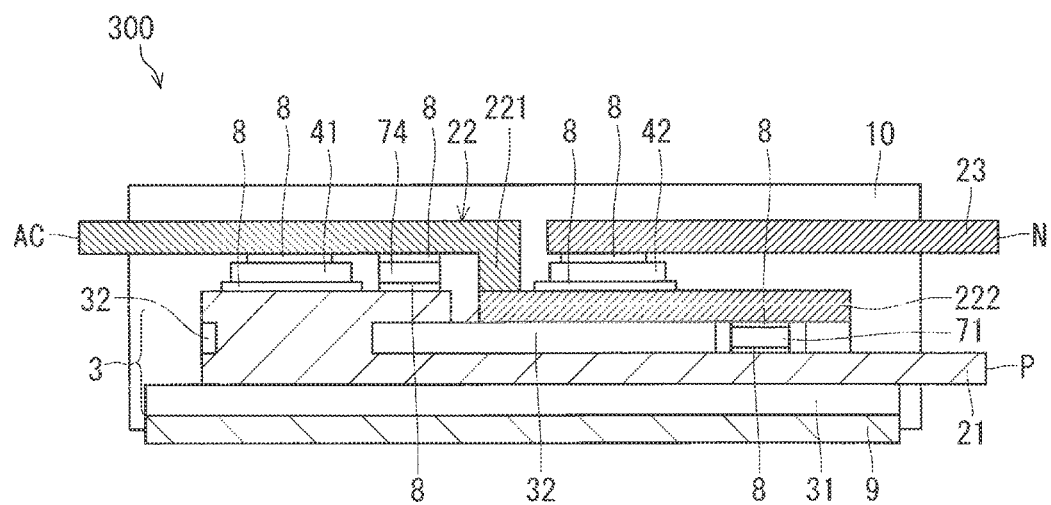
FIG. 8 is a cross-sectional view of a semiconductor module according to a third preferred embodiment.

FIG. 8 is across-sectional view of a semiconductor module 300 according to a third preferred embodiment. In the third preferred embodiment, the semiconductor module 300 further includes a circuit element 74 with respect to the semiconductor module 100 (FIG. 1). The other components, which are the same as those of the semiconductor module 100, are not described herein.

As illustrated in FIG. 8, the circuit element 74 is disposed between the first metal plate 21 and the first portion 221 of the second metal plate 22. Respective electrodes at both ends of the circuit element 74 are bonded, in a face-to-face manner, to the first metal plate 21 and the first portion 221 of the second metal plate 22 facing each other in a vertical direction, through the conductive bonding material 8. The circuit element 74 is sealed by the insulating resin 10. The circuit element 74 is bonded between the electrode P and the electrode AC, in parallel with the first switching element 41.

In the third preferred embodiment, the semiconductor module 300 includes the two circuit elements 71 and 74. The semiconductor module 300 is simply required to include multiple circuit elements. Further, in the third preferred embodiment, the circuit elements 71 and 74 are bonded between the first and second metal plates 21 and 22. In some embodiments, these circuit elements are bonded in another position. For instance, the circuit elements 71 and 74 may be bonded between the second and third metal plates 22 and 23 (i.e., between the electrode AC and the electrode N), or between the first and third metal plates 21 and 23 (i.e., between the electrode P and the electrode N).

<Effect>

In the third preferred embodiment, the semiconductor module 300 is configured such that the at least one circuit element includes a plurality of circuit elements, and that the insulating substrate 32, i.e., the insulating material is disposed between two (first and second metal plates 21 and 22) of the plurality of metal plates (first, second, and third metal plates 21, 22, and 23), facing each other in a vertical direction. The semiconductor module 300 is also configured such that the at least one (circuit element 71) of the plurality of circuit elements 71 and 74 is bonded between the two metal plates, facing each other in such a manner that the at least one circuit element extends through the insulating substrate 32. The semiconductor module 300 is also configured such that the insulating material 10, i.e., the insulating material is disposed between two (first and second metal plates 21 and 22) of the plurality of metal plates, facing each other. The semiconductor module 300 is also configured such that the at least one (circuit element 74) of the plurality of circuit elements 71 and 74 is bonded between the two metal plates facing each other, and is sealed by the insulating resin 10.

In the third preferred embodiment, the semiconductor module 300 is configured such that the circuit element 71 is bonded between the two metal plates facing each other with the insulating substrate 32 interposed therebetween, and that the circuit element 74 is bonded between the two metal plates facing each other with the insulating resin 10 interposed therebetween. Such flexible arrangement of the circuit elements 71 and 74 enables the circuit elements 71 and 74 to be disposed in positions that are effective in, for instance, preventing a power module from its oscillations and reducing switching losses. In addition, incorporating the circuit elements 71 and 74 into the semiconductor module 300 simplifies a circuit configuration that is connected outside the semiconductor module 300.

Fourth Preferred Embodiment

Figure 9:
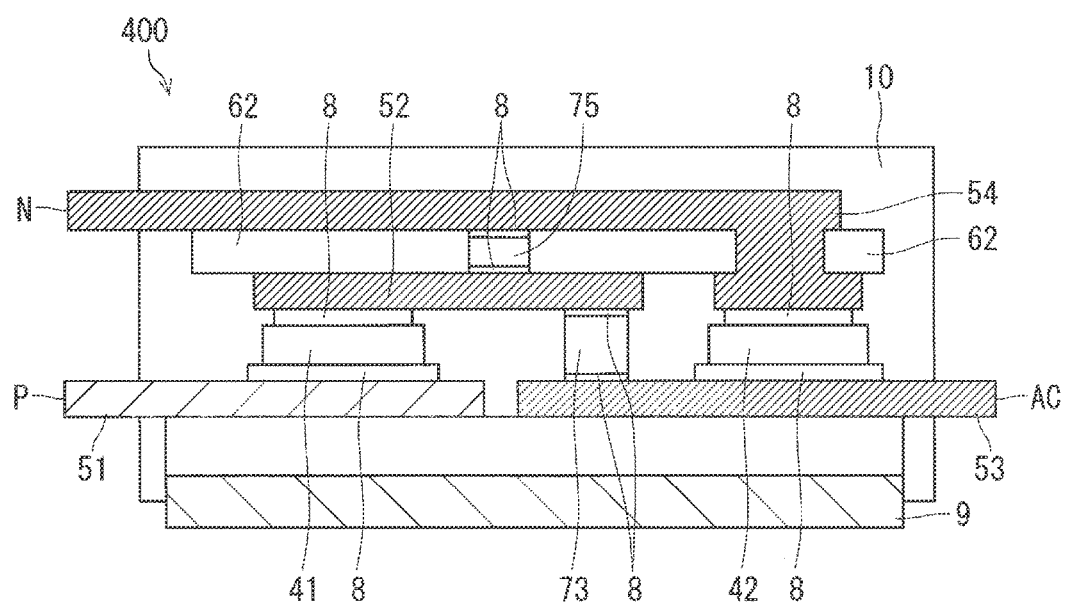
FIG. 9 is a cross-sectional view of a semiconductor module according to a fourth preferred embodiment.

FIG. 9 is a cross-sectional view of a semiconductor module 400 according to a fourth preferred embodiment. In the fourth preferred embodiment, the semiconductor module 400 further includes a circuit element 75 with respect to the semiconductor module 200 (FIG. 7). The other components, which are the same as those in the semiconductor module 200, are not described herein.

As illustrated in FIG. 7, the circuit element 75 is disposed between the second metal plate 52 and the fourth metal plate 54. Electrodes at both ends of the circuit element 75 are bonded, in a face-to-face manner, to the respective second metal plate 52 and fourth metal plate 54 facing each other in a vertical direction, through the conductive bonding material 8. The circuit element 75 extends through the insulating substrate 62 disposed between the second metal plate 52 and the fourth metal plate 54.

In the fourth preferred embodiment, the semiconductor module 400 includes the two circuit elements 73 and 75. The semiconductor module 400 is simply required to include multiple circuit elements. Further, in some embodiments, the circuit elements 73 and 75 are each bonded to a different position than that illustrated in FIG. 9. For instance, the circuit elements 73 and 75 may be bonded between the first and second metal plates 51 and 52, between the third and fourth metal plates 53 and 54 (i.e., between the electrode AC and the electrode N), or between the first and fourth metal plates 51 and 54 (i.e., between the electrode P and the electrode N).

<Effect>

In the fourth preferred embodiment, the semiconductor module 400 is configured such that the at least one circuit element includes a plurality of circuit elements, and that the insulating substrate 62, i.e., the insulating material is disposed between two (second and fourth metal plates 52 and 54) of the plurality of metal plates (first, second, third, and fourth metal plates 51, 52, 53, and 54), facing each other in a vertical direction. The semiconductor module 400 is also configured such that at least one (circuit element 75) of the plurality of circuit elements 73 and 75 is bonded between the two metal plates facing each other in such a manner that the at least one circuit element extends through the insulating substrate 62. The semiconductor module 400 is also configured such that the insulating resin 10, i.e., the insulating material is disposed between two (second and third metal plates 52 and 53) of the plurality of metal plates, facing each other in a vertical direction. The semiconductor module 400 is also configured such that the at least one (circuit element 73) of the plurality of circuit elements 73 and 75 is bonded between the two metal plates facing each other, and is sealed by the insulating resin 10.

In the fourth preferred embodiment, the semiconductor module 400 is configured such that the circuit element 75 is bonded between the two metal plates facing each other with the insulating substrate 62 interposed therebetween, and that the circuit element 73 is bonded between the two metal plates facing each other with the insulating resin 10 interposed therebetween. Such flexible arrangement of the circuit elements 73 and 75 enables the circuit elements 73 and 75 to be disposed in positions that are effective in, for instance, preventing a power module from its oscillations and reducing switching losses. In addition, incorporating the circuit elements 73 and 75 into the semiconductor module 400 simplifies a circuit configuration connected outside the semiconductor module 400.

Figure 10:
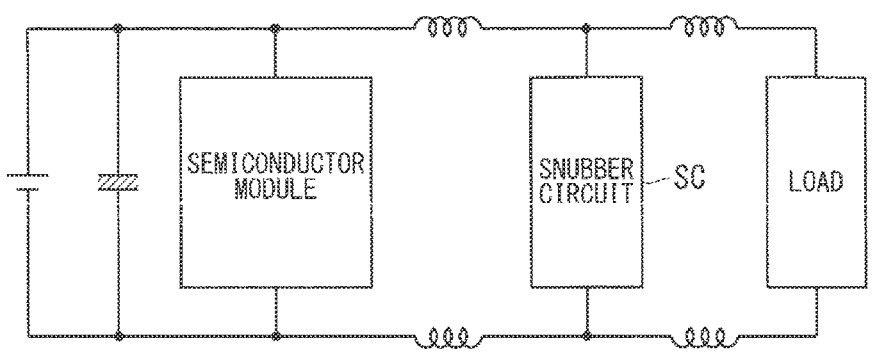
FIG. 10 is a diagram of a circuit configuration of a semiconductor module with a snubber circuit connected outside the semiconductor module.

As illustrated in FIG. 10, the snubber circuit SC typically needs to be connected outside the semiconductor module, in order to reduce or eliminate an overshoot and oscillations of voltage and current, occurring in turn-on and turn-off operations of the switching element of the semiconductor module. Unfortunately, when the snubber circuit SC is connected outside the semiconductor module, a noise in a wire portion in which the semiconductor module and the snubber circuit SC are connected together, or a circuit inductance possibly causes a reduction in effect of the snubber circuit SC. Hence, the configuration of the snubber circuit SC needs to be changed in conformance with the wire portion in which the semiconductor module and the snubber circuit SC are connected together.

In contrast, as illustrated in FIG. 11, the aforementioned first to fourth preferred embodiments enable the circuit elements 71 to 75, each of which is the passive element, such as the capacitor or the resistor element, to constitute the snubber circuit SC, so that the snubber circuit SC is incorporated into the semiconductor module. The snubber circuit SC is disposed inside the semiconductor module. This enables the snubber circuit to be disposed in a position close to the switching element. Consequently, the snubber circuit is effectively operable. In addition, the configuration of the snubber circuit SC no longer needs to be changed in conformance with a wire outside the semiconductor module.

A semiconductor module that includes a SiC switching element, in particular, is expected to be used under a high frequency of 20 kHz or greater. Faster switching speeds equate with more oscillations. Accordingly, such a snubber circuit SC that includes the passive element such as the capacitor is needed. Using the passive element to constitute the snubber circuit reduces the oscillations. Further, the snubber circuit SC is desirably placed near the switching element.

The semiconductor module in the first to fourth preferred embodiments further includes the snubber circuit SC that prevents the surge voltage generated during the switching operations of the switching elements 41 and 42. The snubber circuit SC includes a part of the plurality of metal plates and the at least one circuit element. Thus, incorporating the snubber circuit SC into the semiconductor module enables the snubber circuit to be disposed in a position close to the switching element. Consequently, the snubber circuit is effectively operable. In addition, the configuration of the snubber circuit SC no longer needs to be changed in conformance with the wire outside the semiconductor module.

In the first to fourth preferred embodiments, the circuit elements 71 to 75 include passive elements. The passive elements are each the capacitor or resistor element. The use of the circuit elements 71 to 75 as the passive elements, such as the capacitors or the resistor elements provides the snubber circuit.

In the first to fourth preferred embodiments, the switching elements 41 and 42 may be IGBTs. Alternatively, the switching elements 41 and 42 may be MOSFETs. Alternatively, the switching elements 41 and 42 may contain silicon carbide. The bonded portion is firmly bonded in the semiconductor module according to the first to fourth preferred embodiments. Such a semiconductor module is particularly effective when the user applies a large current and a high voltage using the switching elements, such as the IGBTs or the MOSFETs. In addition, the use of silicon carbide to form the switching elements 41 and 42 enables high-speed switching operations at a speed of, for instance, 20 kHz or greater, in a high-temperature environment. Thus, the use of the circuit elements 71 to 75 as the elements, such as the capacitors or the resistor elements so as to form the snubber circuit, reduces oscillations of the switching elements.

It is to be noted that in the present invention, the individual preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module comprising:
   a plurality of metal plates extending in a horizontal direction and stacked in a vertical direction;
   at least one switching element; and
   at least one circuit element, wherein
   said at least one switching element is bonded between two of said plurality of metal plates, facing each other in a vertical direction,
   said at least one circuit element is bonded between two of said plurality of metal plates, facing each other in a vertical direction,
   an insulating material is disposed between said plurality of metal plates, and
   at least one of said plurality of metal plates is bonded to said switching element and said circuit element.

2. The semiconductor module according to claim 1, wherein
   an insulating substrate is disposed between two of said plurality of metal plates, facing each other, said insulating substrate being said insulating material, and
   said at least one circuit element is bonded between said two metal plates facing each other in a vertical direction in such a manner that said at least one circuit element extends through said insulating substrate.

3. The semiconductor module according to claim 1, wherein
   an insulating resin is disposed between two of said plurality of metal plates, facing each other, said insulating resin being said insulating material, and
   said at least one circuit element is bonded between said two metal plates facing each other in a vertical direction, and is sealed by said insulating resin.

4. The semiconductor module according to claim 1, wherein
   said at least one circuit element comprises a plurality of circuit elements,
   an insulating substrate is disposed between two of said plurality of metal plates, facing each other in a vertical direction, said insulating substrate being said insulating material,
   said at least one of said plurality of circuit elements is bonded between said two metal plates facing each other in such a manner that said at least one circuit element extends through said insulating substrate,
   an insulating resin is disposed between two of said plurality of metal plates, facing each other in a vertical direction, said insulating resin being said insulating material, and
   said at least one of said plurality of circuit elements is bonded between said two metal plates facing each other, and is sealed by said insulating resin.

5. The semiconductor module according to claim 1, wherein
   said at least one circuit element comprises a plurality of circuit elements, and
   said plurality of circuit elements connected in series are bonded between two of said plurality of metal plates, facing each other in a vertical direction.

6. The semiconductor module according to claim 1, wherein said at least one switching element comprises electrodes on both surfaces, said electrodes on both surfaces of said at least one switching element are bonded, in a face-to-face manner, to respective two of said plurality of metal plates, facing each other in a vertical direction, through a conductive bonding material, said at least one circuit element comprises electrodes at both ends, and said electrodes at both ends of said at least one circuit element are bonded, in a face-to-face manner, to respective two of said plurality of metal plates, facing each other in a vertical direction, through a conductive bonding material.

7. The semiconductor module according claim 1, further comprising a snubber circuit configured to prevent a surge voltage caused by a switching operation of said at least one switching element, wherein said snubber circuit comprises a part of said plurality of metal plates and said at least one circuit element.

8. The semiconductor module according to claim 1, wherein said at least one circuit element comprises a passive element, and said passive element is a capacitor or a resistor element.

9. The semiconductor module according to claim 1, wherein each of said plurality of metal plates has a thickness of 0.25 mm or greater.

10. The semiconductor module according to claim 2, wherein said insulating substrate contains a ceramic material, and said insulating substrate has a thickness of 0.32 mm or greater.

11. The semiconductor module according to claim 4, wherein said insulating substrate contains a ceramic material, and said insulating substrate has a thickness of 032 mm or greater.

12. The semiconductor module according to claim 3, wherein said insulating resin has a thickness of 0.1 mm or greater.

13. The semiconductor module according to claim 4, wherein said insulating resin has a thickness of 0.1 mm or greater.

14. The semiconductor module according to claim 1, wherein said at least one switching element is an IGBT.

15. The semiconductor module according to claim 1, wherein said at least one switching element is a MOSFET.

16. The semiconductor module according to claim 14, wherein said at least one switching element contains silicon carbide.

17. The semiconductor module according to claim 15, wherein said at least one switching element contains silicon carbide.

* * * * *